United States Patent
Holm et al.

(10) Patent No.: US 7,201,802 B2
(45) Date of Patent: Apr. 10, 2007

(54) APPARATUS FOR PROVIDING A SUBSTRATE WITH VISCOUS MEDIUM

(75) Inventors: William Holm, Stockholm (SE); Nils Jacobsson, Järfälla (SE)

(73) Assignee: Mydata Automation AB, Bromma (SE)

( * ) Notice: Subject to any disclaimer, the term of this patent is extended or adjusted under 35 U.S.C. 154(b) by 164 days.

(21) Appl. No.: 09/902,110

(22) Filed: Jul. 11, 2001

(65) Prior Publication Data

US 2002/0014602 A1 Feb. 7, 2002

(30) Foreign Application Priority Data

Jul. 11, 2000 (SE) .................................. 0002618

(51) Int. Cl.
*B05C 11/10* (2006.01)

(52) U.S. Cl. .................... 118/663; 118/713; 118/712; 427/8; 427/10

(58) Field of Classification Search ............... 118/712, 118/713, 663, 715; 427/8, 10
See application file for complete search history.

(56) References Cited

U.S. PATENT DOCUMENTS

| | | | |
|---|---|---|---|
| 3,580,462 A * | 5/1971 | Vanyi | 228/51 |
| 3,689,987 A | 9/1972 | Teague | |
| 3,738,760 A | 6/1973 | Madeira | |
| 3,962,487 A | 6/1976 | Fuller et al. | |
| 4,239,827 A | 12/1980 | Notaro | |
| 4,660,771 A | 4/1987 | Chabert et al. | |
| 5,108,024 A * | 4/1992 | Kazem-Goudarzi et al. | 228/104 |
| 5,151,299 A | 9/1992 | Itsuji | |
| 5,320,250 A | 6/1994 | La et al. | |
| 5,505,777 A | 4/1996 | Ciardella et al. | |
| 5,558,504 A | 9/1996 | Stridsberg | |
| 5,574,801 A * | 11/1996 | Collet-Beillon | 382/150 |
| 5,711,989 A * | 1/1998 | Ciardella et al. | 118/663 |
| 5,740,729 A * | 4/1998 | Hikita et al. | 101/126 |
| 5,839,188 A | 11/1998 | Pommer | |
| 5,912,732 A | 6/1999 | Sekine | |
| 5,913,455 A | 6/1999 | La et al. | |
| 5,947,022 A | 9/1999 | Freeman et al. | |
| 6,026,176 A * | 2/2000 | Whitman | 382/146 |
| 6,033,503 A * | 3/2000 | Radowicz et al. | 118/712 |
| 6,036,994 A * | 3/2000 | Tanaka et al. | 427/10 |
| 6,100,787 A | 8/2000 | Huang et al. | |

(Continued)

FOREIGN PATENT DOCUMENTS

| | | |
|---|---|---|
| JP | 2-200376 | 8/1990 |
| JP | 4239797 | 8/1992 |
| WO | WO99/24211 | 5/1999 |

(Continued)

OTHER PUBLICATIONS

Article by Robert Kirkpatrick—"Two-Dimensional, Closed-loop Inspection of Stencil Printing"—published in SMT/Jul. 1999.

*Primary Examiner*—George Koch
(74) *Attorney, Agent, or Firm*—Birch, Stewart, Kolasch & Birch, LLP

(57) ABSTRACT

Solder paste application, inspection and correction. Following or during application of solder paste on a substrate, the result thereof is inspected and any detected errors are registered. Following an evaluation as to whether correction of these errors is required and if it would be worthwhile, the errors are corrected. The correction involves removing solder paste from locations where so required, and jetting of additional solder paste to locations where so required.

42 Claims, 7 Drawing Sheets

U.S. PATENT DOCUMENTS

| | | |
|---|---|---|
| 6,264,097 B1 | 7/2001 | Sano |
| 6,450,416 B1 * | 9/2002 | Berg et al. .................. 239/4 |
| 6,511,545 B2 * | 1/2003 | Banno et al. ............. 118/688 |
| 6,541,063 B1 * | 4/2003 | Prentice et al. ........... 118/712 |
| 6,613,240 B2 | 9/2003 | Skinner et al. |
| 6,692,095 B1 | 2/2004 | Marumoto et al. |
| 2002/0015780 A1 | 2/2002 | Holm et al. |

FOREIGN PATENT DOCUMENTS

| | | |
|---|---|---|
| WO | WO99/64167 | 12/1999 |
| WO | WO 00/42381 | 7/2000 |

* cited by examiner

APPARATUS FOR PROVIDING A SUBSTRATE WITH VISCOUS MEDIUM

TECHNICAL FIELD OF THE INVENTION

The present invention generally relates to the field of providing substrates with viscous medium. More specifically, the invention relates to a method of providing a substrate with viscous medium, a corresponding apparatus, an apparatus for correcting application errors in connection with the application of viscous medium on a substrate, and a method for correcting application errors.

BACKGROUND OF THE INVENTION

In the field of electronics production, it is well known that possible sources of errors are the electronic circuit boards. Mainly, these errors originate from the application of viscous medium, e.g. solder paste, prior to the mounting of components on the board. Over the years, a number of different techniques have been proposed for detecting errors resulting from solder paste application. Originally, this detection was performed manually. Lately, however, the use of cameras in combination with image processing have become the preferred choice for detecting said errors. An example of this can be found in the International Patent Publication WO 00/42381, which discloses a method and a device for contactless inspection of objects on a substrate.

When errors resulting from the application of solder paste have been detected, and preferably identified, appropriate action must ensue. Traditionally, a board containing errors as a result of the application of solder paste is simply taken out of the process. The removed board can then be discarded or, commonly, cleaned and subsequently reinstated at the beginning of the process. Recently, the results of the solder paste application, i.e. critical parameters thereof, are monitored and errors are identified, and the monitored parameters are fed back so that appropriate measures can be taken. This is common in state-of-the-art screen printing applications.

This feedback can, in the simplest case, be a warning message when a parameter has crossed a certain preset limit. The operator can then decide which actions to take. On the other hand, an advanced system could incorporate artificial intelligence to adjust application parameters such as, in the case of screen printing, squeegee pressure, speed and angle, amount of paste on the stencil, cleaning interval, etc. Thus, critical process parameters can be monitored and adjusted so that the application errors can be reduced. However, the specific board containing the detected errors is dealt with in the traditional manner described above, i.e. the faulty board is removed from the entire process.

When using conventional dispensing, i.e. contact dispensing, as opposed to screen printing for the application of solder paste, dispensing heads with integrated measurement capabilities, for measuring the result of the application of solder paste, are known within the art. The measured parameters can be fed back for process control in order to reduce future errors. Since the integrated measurement capabilities can measure the solder paste application of a single dot, e.g. immediately following the dispensing of said dot, process parameters can be altered for the subsequent dispensing of dots on the same board. Thereby, small errors can be detected and process parameters adjusted so that, in the best case, major errors requiring the board to be removed from the process, can be avoided.

SUMMARY OF THE INVENTION

Thus, an object of the present invention is to provide a solution to the above-mentioned problems and to provide an improved production efficiency.

This and other objects are achieved according to the present invention by providing an apparatus and a method as will be described below.

In general terms, the invention is based on the insight of the advantageous results that can be obtained by using correction measures in relation to the application of viscous medium on a substrate.

According to a first aspect of the invention, there is provided a method of providing a substrate with viscous medium, comprising the steps of applying said viscous medium onto the substrate, inspecting the results of said application, determining errors of the application based on said inspection, and correcting at least some of said errors.

According to a second aspect of the invention there is provided a system or an apparatus for providing a substrate with a viscous medium, comprising an applicator for applying the viscous medium onto the substrate, an inspection device for inspecting the results of said application, a processor for determining application errors based on said inspection, and correction device for correcting at least some of said errors.

According to a third aspect of the invention there is provided an apparatus for correcting application errors in connection with application of a viscous medium on a substrate, said apparatus comprising a processor adapted to receive information of said errors in the application of said viscous medium, and a correction device for correcting at least some of said errors based on said information.

According to a fourth aspect of the present invention, there is provided a method of correcting application errors in regard to viscous medium provided on a substrate, comprising the steps of providing a jetting device, and using said jetting device for correcting said errors.

For the purposes of this application, it is to be noted that the term "viscous medium" should be interpreted as solder paste, flux, adhesive, conductive adhesive, or any other kind of medium used for fastening components on a substrate, or resistive paste; and that the term "substrate" should be interpreted as a printed circuit board (PCB), a substrate for ball grid arrays (BGA), chip scale packages (CSP), quad flat packages (QFP), and flip-chips or the like. It is also to be noted that the term "jetting" should be interpreted as a non-contact dispensing process that utilises a fluid jet to form and shoot droplets of a viscous medium from a jet nozzle onto a substrate, as compared to a contact dispensing process, such as "fluid wetting", which is the act of the viscous medium leaving the dispense tip, contacting and clinging to the substrate and remaining on the substrate as the dispense tip pulls away.

Preferably, use is made of a jetting device and/or a removing device for the correction of errors resulting from the application of a viscous medium on a substrate. Said correction is performed after the application of said viscous medium, but prior to any soldering thereof. Preferably, said correction is also performed prior to the mounting of components, at the locations on the substrate where correction is required. It must, however, be noted that the correction of said errors can be performed after mounting of components at other locations on the substrate. This is for instance the case when mounting components on both sides of a substrate. Then, correction of errors according to the present application can be performed at one side after components have been mounted and attached to the other side of the substrate.

Thus, the correction of viscous medium applied on a substrate according to the present invention must not be mistaken for the known correction of soldered connections, which is performed late in the component mounting cycle after the mounting of components and hardening of the viscous medium, i.e. reflow of solder paste, used for mechanically and electrically connecting the component to the substrate. An advantage of correcting errors prior to the mounting of components and hardening of the viscous medium is that it is much cheaper, as compared to making corrections late in the mounting process cycle. This is due to the fact that valuable production capacity is not occupied by a substrate that must be corrected. Further, correction performed prior to the mounting of components is easier and requires less correction steps.

According to the present invention, said application of viscous medium is not intended to be limited to a particular method of applying viscous medium, i.e. application through e.g. screen printing, conventional dispensing, jetting, etc. On the contrary, the present invention is intended to be applicable for the correction of any substrate that is provided with a viscous medium, regardless of how the viscous medium was originally applied.

According to one embodiment of the present invention, following the application of viscous medium on a substrate, the result of said application is inspected. This inspection can be performed after the completion of the application of viscous medium on the entire substrate, or can be performed during said application, e.g. at intermittent intervals or continuously, depending on the application method being used. When applying the viscous medium through screen printing, the inspection is preferably performed when the application is completed. When applying viscous medium through contact dispensing or jetting, the inspection can be performed following the dispensing of viscous medium at each specific site or position, or at certain predetermined intervals.

The inspection not only detects whether a site or position has been provided with viscous medium, but also detects whether the correct amount, i.e. volume, of viscous medium has been applied, whether the position of the applied medium is correct, or within a predetermined fault range, and has the correct shape and height at a given position. The term "correct" has here the meaning of the measured parameter being within a fault range that is predetermined.

According to alternative embodiments of the invention, the inspection could involve inspection of the entire substrate, all locations on the substrate where viscous medium is to be applied, or only specific locations on the substrate. The latter would preferably involve inspecting specific locations that are particularly error prone, e.g. locations where components are later to be placed which are particularly sensitive to errors in the applied viscous medium, such as components having leads with a very fine pitch, or components which are difficult to inspect after soldering, such as BGA components.

According to an embodiment of the invention, following the detection of an error, the characteristics of said detected error are determined and stored. Preferably, the error characteristics are further analyzed and evaluated to determine whether the error needs correcting. If so, the proper method of correcting said error is also determined. According to an embodiment, the time needed for performing said correction is estimated and stored.

According to an embodiment of the invention, the application of viscous medium is performed through screen printing. Following the completion of the screen printing, the result of the screen printing is inspected and any errors are detected, determined, and analyzed. The results of said inspection can be fed back to the screen printer for enabling the screen printer to correct or adjust parameters. Following the inspection and determination of errors, correction of the determined errors ensues.

According to another embodiment of the invention, the application of viscous medium is performed using conventional contact dispensing or jetting. This enables continuous, on-line inspection of the results of said application. Thus, the application of viscous medium at a single location can be immediately inspected, e.g. dot by dot, or deposit by deposit, and the results can both be fed back for adjustment of dispensing or jetting parameters, or can be immediately transferred to a device for correcting any detected errors. According to an alternative embodiment, the inspection is performed following the completion of the application of viscous medium on the entire substrate. Then, and as described above, the inspection could involve inspecting the entire substrate, all locations on the substrate where viscous medium is to be applied, or predetermined specific locations on the substrate.

According to the present invention, the correction of determined errors on a substrate is performed by the use of jetting for applying additional viscous medium. Not only is jetting faster, jetting is also more accurate and more flexible in comparison with conventional dispensing. The use of conventional dispensing often provide a bottle neck that increases the cycle time in the overall component mounting process, as compared to the use of jetting. It has also been found that it is possible to achieve smaller dots when using jetting than when using conventional dispensing. Further, by using jetting, it is possible to apply dots of viscous medium having differing heights, which is difficult when using screen printing.

However, at positions where it has been determined that there has been applied too much viscous medium, the surplus viscous medium must be removed. This is performed according to an embodiment of the invention by the provision of a removing device capable of removing viscous medium from a specific location on the board. Said removal is preferably performed through suction of the viscous medium, preferably in combination with heating the viscous medium prior to the suction thereof. Due to the characteristics of the viscous medium, e.g. solder paste, the remains on the substrate of viscous medium at a location at which removal of the viscous medium has been performed is generally minute. But, there may be some flux remains left at said locations. However, this is not a problem due to the fact that where cleaning of the substrate is performed following the soldering of components, in order to get rid of deleterious flux that is used when mounting the components, said flux remains will be removed during said cleaning; and in cases where it is not necessary to remove flux following said soldering, the flux remains will not be a problem. Thus, additional cleaning of the substrate following the removal of surplus viscous medium will not be necessary.

The combination of a jetting device and a removing device for correcting errors on a substrate provided with viscous medium enables correction of all types of application errors. These errors may for instance include having applied a surplus of viscous medium or insufficient viscous medium at a given position. Furthermore, the errors may for instance include applying viscous medium at incorrect positions, applying viscous medium where the result of the viscous medium application is misaligned, applying viscous medium having characteristics deficiencies of some sort, etc.

According to an embodiment of the present invention, the correction of errors is performed in a separate machine, i.e. the substrate is forwarded to the correction machine following the determination that correction of the result of viscous medium application is required. According to an alternative embodiment, the correction machine also comprises the inspection device described above. Then, all substrates are forwarded to the correction machine for inspection and possible correction of detected errors. Preferably, the results of said inspection are fed back to the machine for allowing adjustment of application parameters.

Said embodiment of having a stand alone correction machine is particularly useful when the initial application of viscous medium is performed by screen printing or contact dispensing. Then, the advantages relating to screen printing and contact dispensing, as recognised by the man skilled in the art and not further described herein, can be combined with the above described advantages of correction of errors through jetting.

According to an alternative embodiment of the invention, the correction device, i.e. a jetting device for correction and a removing device, are integrated in the machine for performing the initial application of viscous medium onto the substrate. Thus, the inspection can be performed continuously and any correction of the substrate necessary can be done instantly.

Said embodiment of having an integrated machine for both the initial application of viscous medium and the ensuing inspection and correction is particularly useful when the initial application of viscous medium is performed by jetting. Thus, a single jetting device can be utilized for both the initial application and the correction. This would facilitate the construction of the machine and minimize the size of the machine and also would provide a small footprint, i.e. the overall floor space required for the machine. Alternatively, the correction is performed by a separate jetting device not used for the initial application of viscous medium. This would decrease the overall time required for the application and the possible correction.

Generally, a separate machine for the correction, and possibly also for the inspection, would increase line length but decrease the overall cycle time for each substrate as compared to an integrated machine as described above incorporating both the initial application of viscous medium and the subsequent or concurrent correction. Further, an integrated machine where the initial application is performed through screen printing or contact dispensing would have to overcome a number of constructional difficulties.

According to a specific embodiment of the present invention, all errors occurring on a single substrate following the completion of the application of viscous medium, e.g. following screen printing, are jointly analyzed and the total amount of corrections needed for the entire substrate is then determined. Thus, it can be determined whether the sum of errors are so great that correction of the errors on the substrate are not worthwhile. Preferably, it has been determined the time required for error correction of each detected error requiring correction, then the overall correction time for the entire substrate is evaluated. If it is found that correction of the errors on the substrate if not worthwhile, the substrate can be removed from the process and cleaned without any corrections being made.

Thus, the use of jetting for correcting errors resulting from the application of viscous medium onto a substrate enables not only error prevention, which is known through the feedback of inspection results, but also error correction. This guarantees that a low defect level can be maintained, which in turn results in the main source of failures in the electronics production is overcome, reducing the production costs considerably. This is done without more than a fractional addition of time required for the overall application of viscous medium on a substrate.

The above mentioned and other aspects, advantages, and features of the invention will be more fully understood from the following description of exemplifying embodiments thereof.

BRIEF DESCRIPTION OF THE DRAWINGS

Exemplifying embodiments of the invention will be described below with reference to the accompanying drawings, in which.

DETAILED DESCRIPTION OF THE PREFERRED EMBODIMENTS

In the block diagrams of FIGS. 1–5, the thick-lined arrows depict the movement of a substrate through the production line. The dashed boxes simply indicate that the device(s) or apparatus(es) depicted within the box can be incorporated in a single machine.

With reference to FIGS. 2–11, there is illustrated exemplary embodiments of the present invention. As to the means or devices used for applying solder paste, inspecting the results of said application, removing solder paste, and component mounting, use can be made of means or devices which by themselves are known within the art, and the constructional features of which are also known. Therefore, a constructional and functional description of each separate means or device has been omitted.

Figure 1:
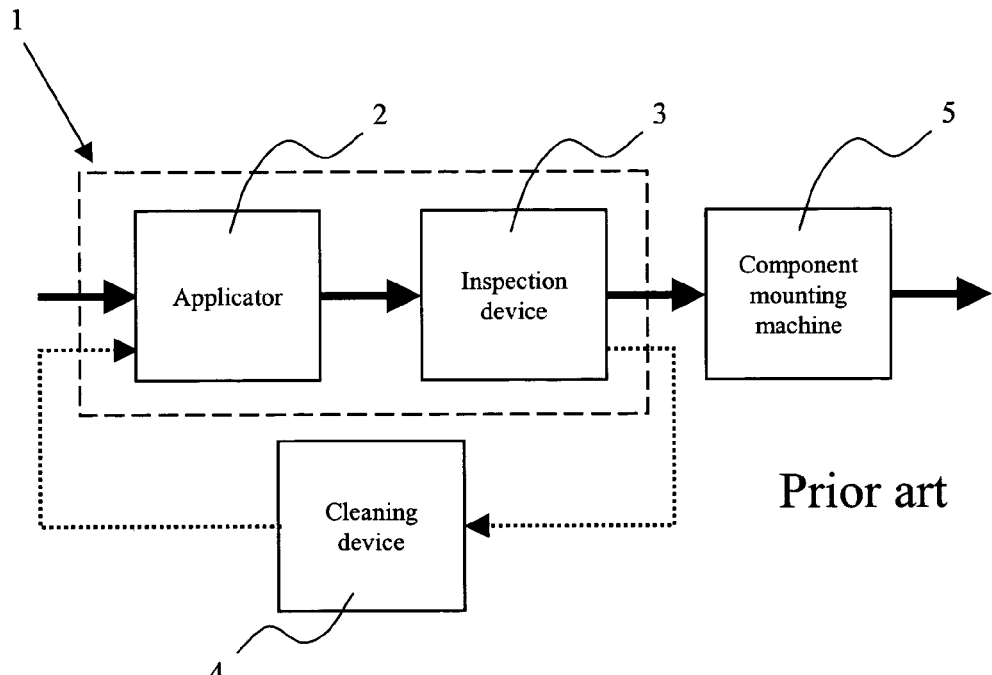
FIG. 1 is a block diagram illustrating a typical prior art arrangement for handling errors resulting from application of viscous medium.

With reference to FIG. 1 there is shown a typical prior art arrangement for handling errors resulting from solder paste application. The solid arrows depict the transportation of a substrate through the arrangement. The substrate is first brought to a machine 2 for application of the solder paste. Following the application of solder paste, the substrate is brought to an inspection device 3 where the result of the application is inspected. When the application is performed through contact dispensing or jetting, the inspection could take place simultaneously with the application. Then, of course, the applicator 2 and the inspection device 3 are incorporated in a single machine 1. If the inspection shows that the result of the solder paste application is satisfactory, then the substrate is conveyed to a component mounting machine 5. If not, then the substrate is taken out of the production line, either discarded or cleaned in a cleaning machine 4 and reinstated in the production line prior to the application machine 2.

Figure 2:
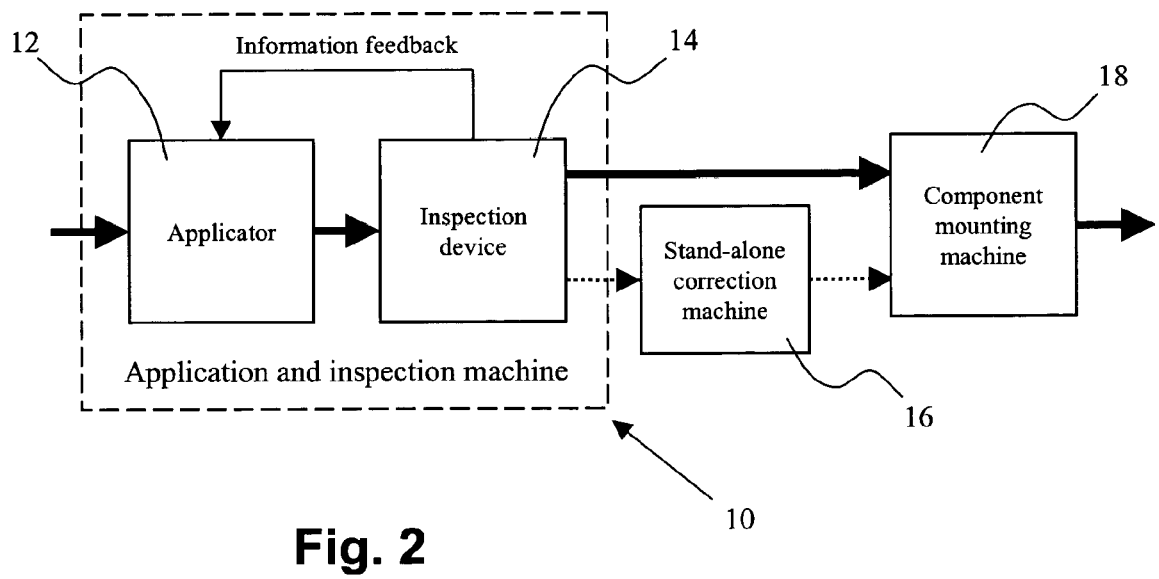
FIGS. 2–5 are block diagrams illustrating arrangements according to alternative embodiments of the present invention.

There will now be described with reference to FIGS. 2 and 6, a first embodiment of the present invention for correcting errors resulting from solder paste application. A substrate is first brought to an application and inspection machine 10, incorporating both an applicator 12 and an inspection device 14. A conventional method of application is used and therefore not further described. As can be seen from the flow chart in FIG. 6, in this exemplary method 100, solder paste is applied to the substrate at 102. Then the inspection of the application result commences at 104 by indicating the starting point for the inspection. The solder paste application is inspected for a position N at 106. At 108, it is determined whether an error is detected for position N and, if so, the parameters of the detected error, e.g. size of solder paste dot, dot position, dot shape, etc., is recorded and, possibly, also fed back to the applicator at 109. At 110, there is a check whether all positions to be inspected have been inspected. If not, the position parameter N is incremented at 111 and the next position is inspected at 106.

Following the inspection for all selected positions, the parameters are evaluated at 112 to determine whether correction of the substrate is required. If not, the substrate is transferred at 113 to a component mounting machine 18. However, if correction is required, then the total amount of correction needed is calculated at 114. The result of this calculation is defined as a correction value, which at 116 is compared to a threshold value for determining whether correction of the substrate is worthwhile. That is, if there are vast correction actions required, then it might be more economical to simply discard the substrate as at 117. This is of course dependent on the type of substrate and the cost involved for the substrate. If correction is deemed worthwhile, then the substrate is transferred at 118 to a correction machine 16. The correction machine 16 incorporates both a device for removing surplus solder paste, as well as a jetting device for jetting additional solder paste onto the substrate.

As is understood by the man skilled in the art, the above-mentioned steps of recording, evaluating, determining and sending and retrieving information can be performed by the use of a conventional processor (not shown).

Figure 3:
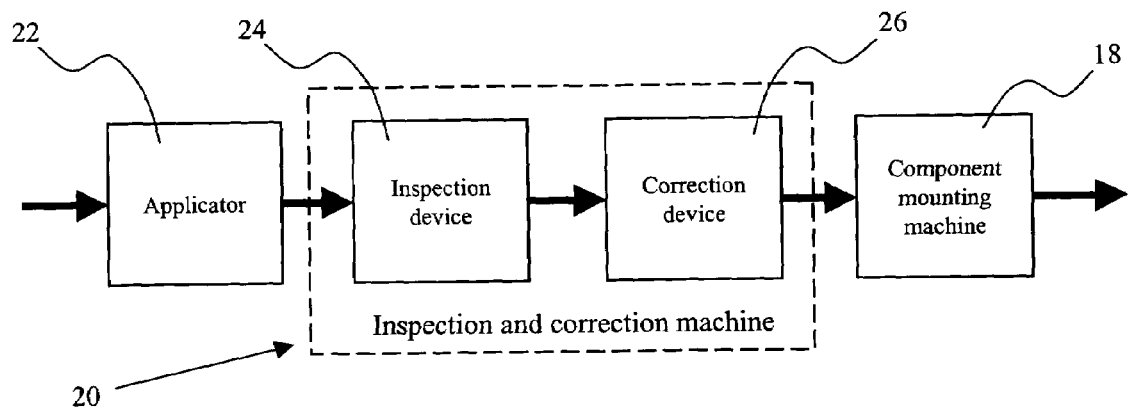
Figure 7:
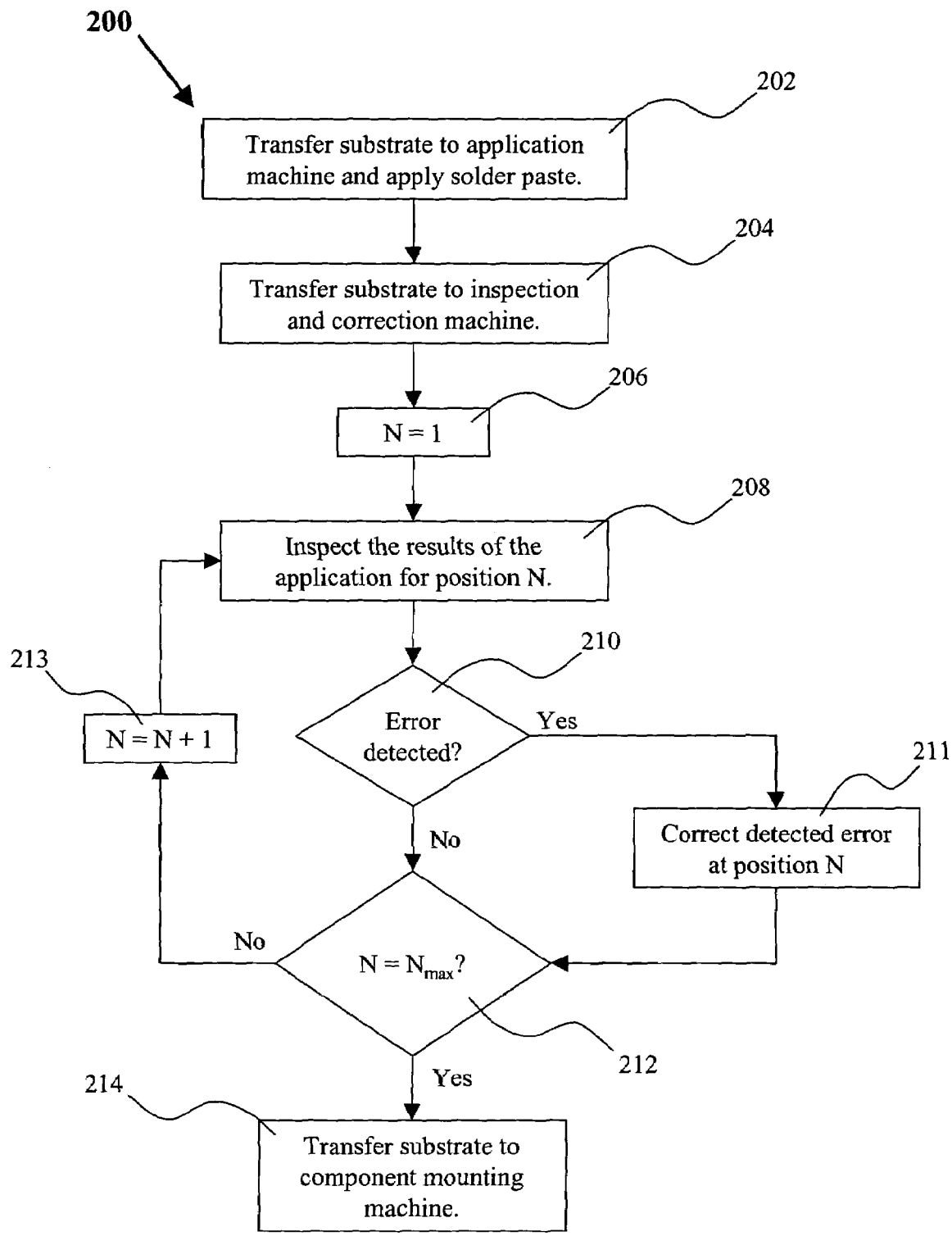

Turning now to FIGS. 3 and 7, there is illustrated a second exemplary embodiment of the present invention. The invention according to this embodiment differs from the first embodiment in that the applicator 22 is not incorporated with the inspection device 24. Instead, the inspection device 24 can be incorporated with a correction device 26 in a combined inspection and correction machine 20. As is shown in the flow chart of FIG. 7, in this exemplary method 200, the substrate is transferred to the applicator 22 at 202 and provided with solder paste. Then, the substrate is at 204 transferred to the inspection and correction machine 20. The inspection of the application result commences at 206, and the inspection device 24 inspects at 208 the solder paste application result for position N.

At 210 it is determined whether the inspection for position N reveals that an error that require correction is detected. If so, the error is corrected by the correction device 26 at step 211. At 212 it is checked whether all positions have been inspected. If so, the substrate is transferred at 214 to the component mounting machine 18. If not, the position parameter N is incremented at 213 and the next position is inspected at 208. For ease of description, it is indicated in FIG. 7 that the correction for position N is performed directly following the inspection for position N.

However, the inspection device 24 might perform an inspection faster than the correction device 26 can perform the corresponding correction. In reality, the inspection is performed as fast as possible, and the information as to which positions require correction, and which correction that is needed, is continuously transmitted to the correction device 26. Thus, the inspection device 24 does not wait at a specific position for the correction device to finish correcting at that position. This applies equally for the embodiment of FIGS. 5 and 11, which will follow.

Figure 4:
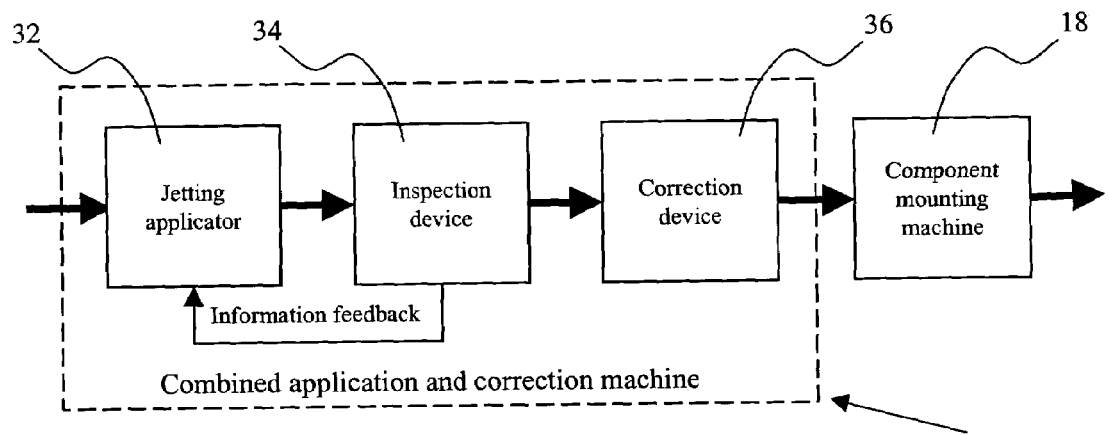
Figure 5:
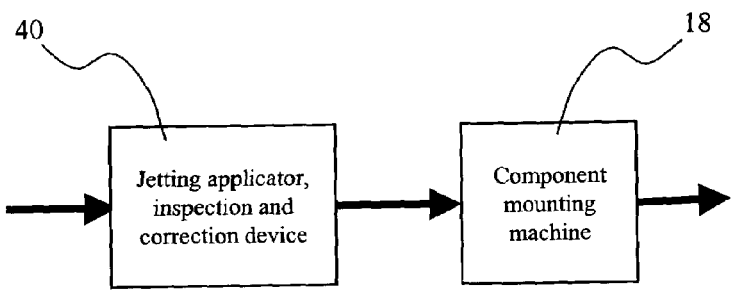

Turning now to FIGS. 4 and 5, there is shown two alternative embodiments where the initial application of solder paste is performed with a jetting device 32, 40. In the embodiment of FIG. 4, at 30, there are provided two separate jetting devices, one for the initial solder paste application, and one included in the correction device 36 for the correctional jetting of additional solder paste. In the embodiment of FIG. 5, the same jetting device is used for both the initial solder paste application, and for the correctional jetting of additional solder paste. Thus, the applicator, inspection device and correction device are all integrated in one machine 40.

Figure 6:
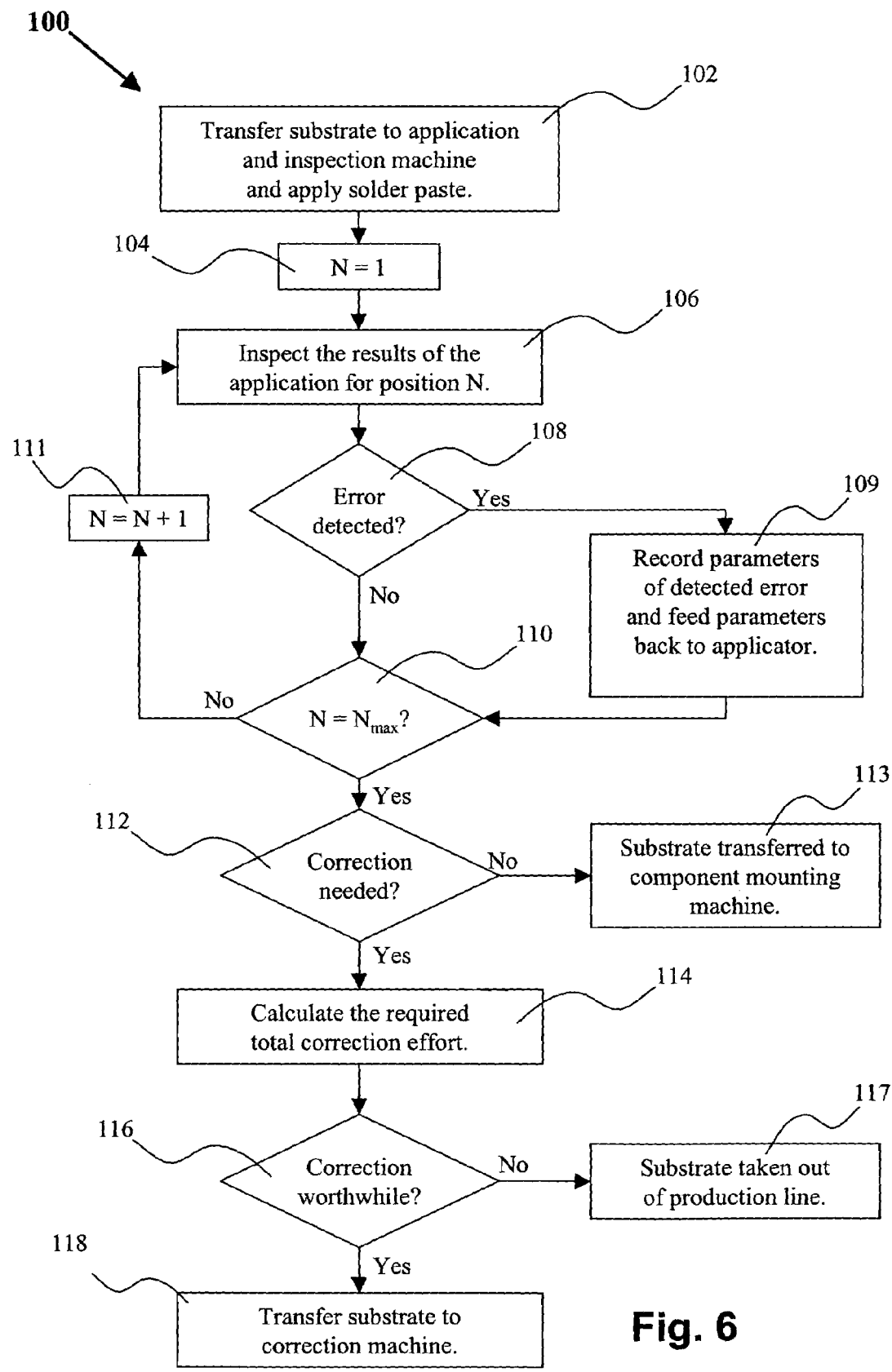
FIGS. 6–11 are flow charts illustrating alternative embodiments of the method according to the present invention.
Figure 8:
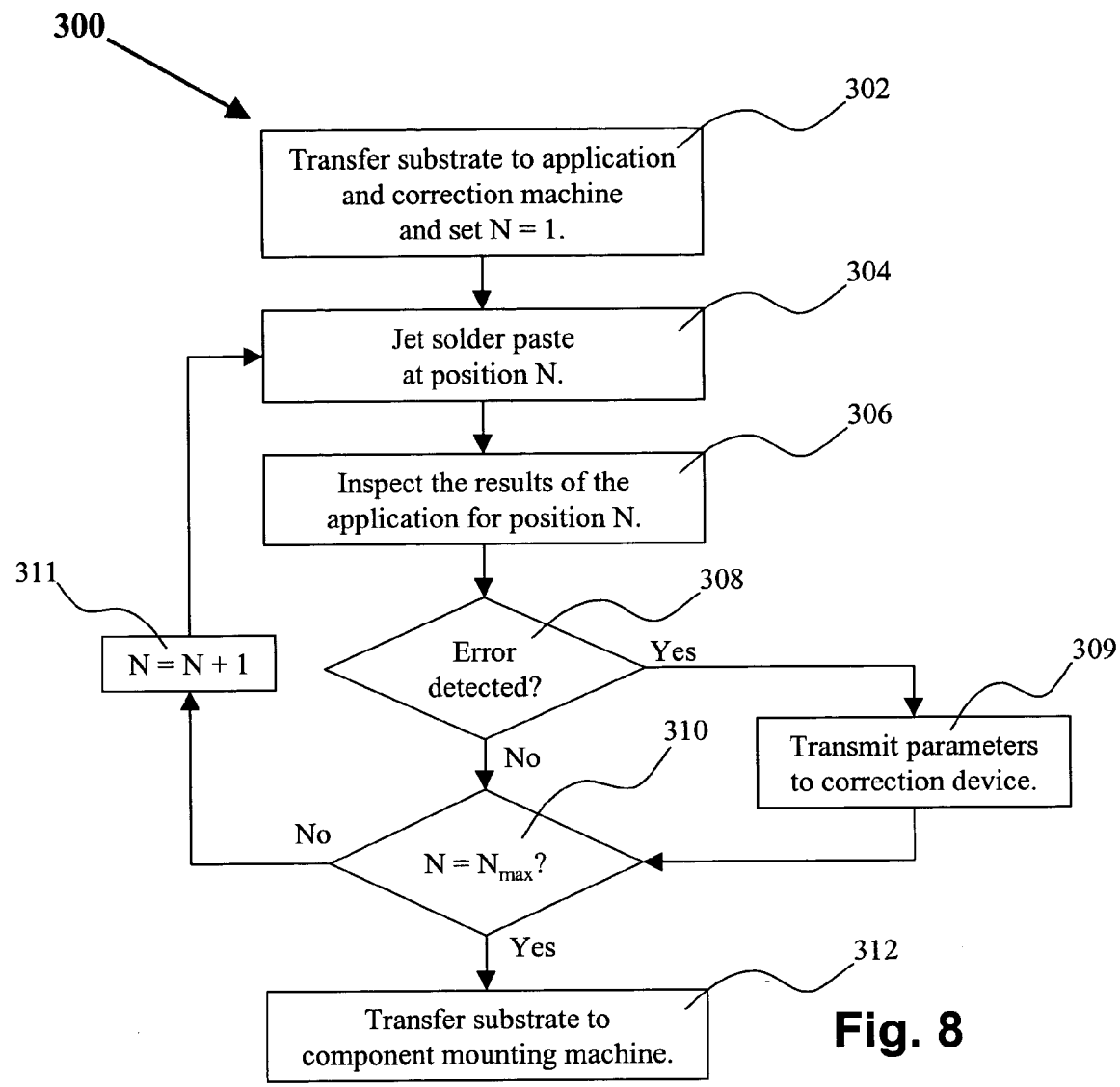
Figure 9:
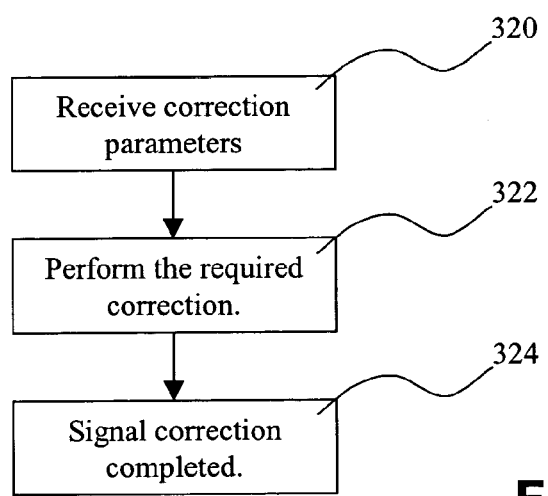

The method 300 for the arrangement illustrated by FIGS. 4, 8 and 9 differs from the methods of FIGS. 6 and 7 in that the application for each position can be essentially immediately inspected. Turning to FIGS. 8 and 9, the substrate is transferred to the application and correction machine at 302, and solder paste is applied through a jetting device 32 for position N at step 304. The result of the application is then inspected by the inspection device 34 at step 306. If correction is required, determined at 308, the correction parameters is relayed to the correction device 36 at step 309. The application and inspection then continues at 304 and 306 until solder paste has been applied and the inspection has been performed for all positions, determined at 310. If the application and inspection has not been completed, the position parameter N is incremented at 311, and the next position is applied at 304. Simultaneously with said application and inspection, the correction device 36 performs correction of the detected errors at 322 based on information received at 320. After each correction has been completed, a signal indicative thereof is transmitted at step 324 to a processor (not shown). At step 310, it is also determined whether all corrections have been completed before the substrate is transferred to the component placement machine 18 at step 312.

Figure 10:
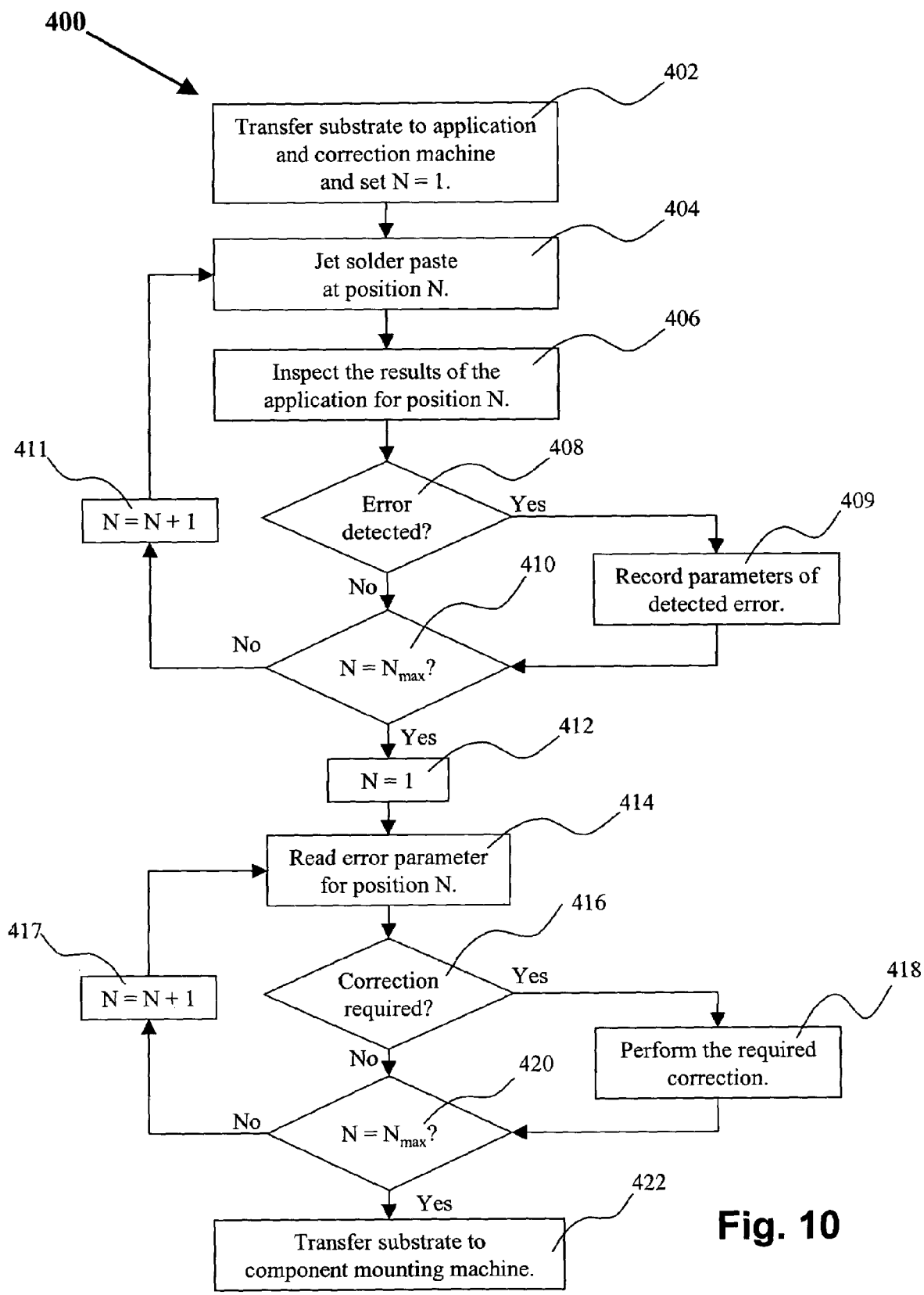
Figure 11:
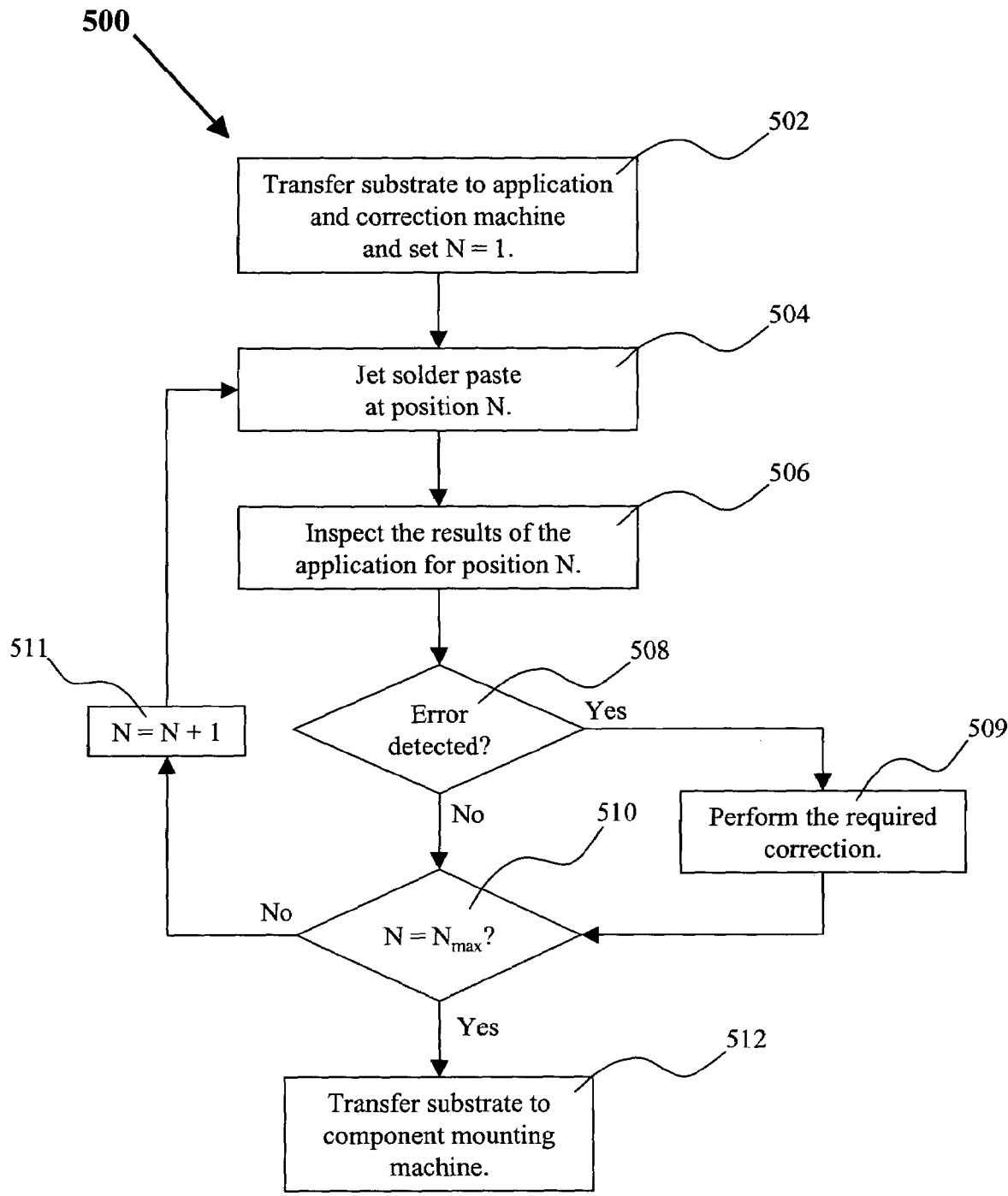

Turning finally to FIGS. 5, 10 and 11, there are illustrated two alternative methods 400, 500 according to alternative embodiments of the present invention. As described above, a single jetting device is used for both the initial application of solder paste and the subsequent possible corrective jetting of additional solder paste. In FIG. 10 there is shown an alternative where the corrective jetting is performed following the completion of the initial application, whereas in FIG. 11 there is shown an alternative where the jetting correction is performed as soon as an error has been detected. As obvious to the man skilled in the art, any combination of these two alternatives is also possible.

The initial steps 402–412 of method 400 correspond closely to the initial steps 102–111 of method 100, as shown in FIG. 6. However, following the completion of the initial solder paste application and the inspection and recording of errors, correction of the detected errors is performed by the correction device, both where additional jetting is required as well as the removal of solder paste. According to FIG. 10, for ease of illustration, this is performed by resetting the position parameter N, at 412 and looping through all positions on the substrate and correcting them in order, at 414–420. However, any type of correction algorithm can be used. Finally, the substrate is transferred at 422 to the component mounting machine 18.

The method 500 shown in FIG. 11 correspond to the method 300 of FIG. 8 for all steps 502–512, except for step 509. In method 500 the required correction is performed at step 509, whereas at step 309 of the method 300, parameters are transmitted to a separate correction device. However, as stated above, the correction for a specific position does not necessarily take place immediately following the inspection of that position.

Even though the invention has been described above using exemplifying embodiments thereof, alterations, modifications and combinations thereof, as understood by those skilled in the art, may be made within the scope of the invention, which is defined by the accompanying claims.

The invention claimed is:

1. An apparatus for providing a substrate with viscous medium, comprising:
   application means for applying the viscous medium onto the substrate at a plurality of locations;
   inspection means for inspecting the results of said application at more than one of the plurality of locations after completion of the application at the plurality of locations;
   processing means for determining application errors based on said inspection, estimating the time required for performing corrective action for each of the determined errors and calculating the overall time required for corrective action of all determined errors; and
   correction means for correcting at least some of said errors.

2. The apparatus according to claim 1, wherein the processing means comprises evaluating means for evaluating each of the determined errors and deciding to what extent the determined errors shall be corrected.

3. The apparatus according to claim 1 or 2, wherein said correction means comprises jetting means for jetting of additional viscous medium onto the substrate and/or removing means for removing surplus viscous medium from the substrate.

4. The apparatus according to claim 1, wherein said application means is a jetting means.

5. The apparatus according claim 3, wherein said application means is a jetting means and wherein said application means and said jetting means for jetting of additional viscous medium is the same jetting means.

6. The apparatus according to claim 1, wherein said application means is a screen printing means.

7. The apparatus according to claim 1, wherein said application means is a contact dispensing means.

8. An apparatus for providing a substrate with viscous medium, comprising:
   an applicator, said applicator applying the viscous medium onto the substrate at a plurality of locations;
   an inspection device, said inspection device inspecting the results of said application at more than one of the plurality of locations after completion of the application at the plurality of locations;
   a processor, said processor determining application errors based on said inspection, estimating the time required for performing corrective action for each of the determined errors and calculating the overall time required for corrective action of all determined errors; and
   a correction device, said correction device correcting at least some of said errors.

9. The apparatus according to claim 8, wherein the processor is arranged for evaluating each of the determined errors and deciding to what extent the determined errors shall be corrected.

10. The apparatus according to claim 8, wherein said correction device comprises a jetting device for jetting of additional viscous medium onto the substrate.

11. The apparatus according to claim 8 or 9, wherein said correction device comprises a removing device for removing surplus viscous medium from the substrate.

12. The apparatus according to claim 8, wherein said applicator is a jetting device.

13. The apparatus according to claim 11, wherein said applicator is a jetting device and wherein said applicator and said jetting device for jetting of additional viscous medium is a single jetting device.

14. The apparatus according to claim 8, wherein said applicator is a screen printer.

15. The apparatus according to claim 8, wherein said applicator is a contact dispenser.

16. The apparatus according to claim 1, wherein said correction means corrects at least some of said errors prior to hardening of the viscous medium.

17. The apparatus according to claim 8, wherein said correction device corrects at least some of said errors prior to hardening of the viscous medium.

18. The apparatus according to claim 1, wherein said correction means corrects at least some of said errors prior to mounting of components on the substrate.

19. The apparatus according to claim 8, wherein said correction device corrects at least some of said errors prior to mounting of components on the substrate.

20. An apparatus for providing a substrate with viscous medium, comprising:
   application means for applying the viscous medium onto the substrate;
   inspection means for inspecting the results of said application;
   processing means for determining application errors based on said inspection, estimating the time required for performing corrective action for each of the determined errors and calculating the overall time required for corrective action of all determined errors; and
   correction means for correcting at least some of said errors.

21. The apparatus according to claim 20, wherein the processing means comprises evaluating means for evaluating each of the determined errors and deciding to what extent the determined errors shall be corrected.

22. The apparatus according to claim 20 or 21, wherein said correction means comprises jetting means for jetting of additional viscous medium onto the substrate and/or removing means for removing surplus viscous medium from the substrate.

23. The apparatus according to claim 20, wherein said application means is a jetting means.

24. The apparatus according claim 22, wherein said application means is a jetting means and wherein said application means and said jetting means for jetting of additional viscous medium is the same jetting means.

25. The apparatus according to claim 20, wherein said application means is a screen printing means.

26. The apparatus according to claim 20, wherein said application means is a contact dispensing means.

27. An apparatus for providing a substrate with viscous medium, comprising:
   an applicator, said applicator applying the viscous medium onto the substrate;
   an inspection device, said inspection device inspecting the results of said application;
   a processor, said processor determining application errors based on said inspection, estimating the time required for performing corrective action for each of the determined errors and calculating the overall time required for corrective action of all determined errors; and a correction device, said correction device correcting at least some of said errors.

28. The apparatus according to claim 27, wherein the processor is arranged for evaluating each of the determined errors and deciding to what extent the determined errors shall be corrected.

29. The apparatus according to claim 27, wherein said correction device comprises a jetting device for jetting of additional viscous medium onto the substrate.

30. The apparatus according to claim 27 or 28, wherein said correction device compnses a removing device for removing surplus viscous medium from the substrate.

31. The apparatus according to claim 27, wherein said applicator is ajetting device.

32. The apparatus according to claim 30, wherein said applicator is a jetting device and wherein said applicator and said jetting device for jetting of additional viscous medium is a single jetting device.

33. The apparatus according to claim 27, wherein said applicator is a screen printer.

34. The apparatus according to claim 27, wherein said applicator is a contact dispenser.

35. The apparatus according to claim 20, wherein said correction means corrects at least some of said errors prior to hardening of the viscous medium.

36. The apparatus according to claim 27, wherein said correction device corrects at least some of said errors prior to hardening of the viscous medium.

37. The apparatus according to claim 20, wherein said correction means corrects at least some of said errors prior to mounting of components on the substrate.

38. The apparatus according to claim 27, wherein said correction device corrects at least some of said errors prior to mounting of components on the substrate.

39. The apparatus according to claim 1, wherein the processing means compares the overall time required for corrective action with a predetermined threshold and determines whether to correct the determined errors or discard the substrate.

40. The apparatus according to claim 8, wherein the processor compares the overall time required for corrective action with a predetermined threshold and determines whether to correct the determined errors or discard the substrate.

41. The apparatus according to claim 20, wherein the processing means compares the overall time required for corrective action with a predetermined threshold and determines whether to correct the determined errors or discard the substrate.

42. The apparatus according to claim 27, wherein the processor compares the overall time required for corrective action with a predetermined threshold and determines whether to correct the determined errors or discard the substrate.

* * * * *